US011891298B2

(12) United States Patent
Quaglia et al.

(10) Patent No.: US 11,891,298 B2
(45) Date of Patent: Feb. 6, 2024

(54) PROCESS FOR MANUFACTURING MICROELECTROMECHANICAL DEVICES, IN PARTICULAR ELECTROACOUSTIC MODULES

(71) Applicant: STMICROELECTRONICS S.r.l., Agrate Brianza (IT)

(72) Inventors: Fabio Quaglia, Pizzale (IT); Marco Ferrera, Concorezzo (IT); Marco Del Sarto, Monza (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/839,131

(22) Filed: Jun. 13, 2022

(65) Prior Publication Data

US 2022/0306456 A1 Sep. 29, 2022

Related U.S. Application Data

(62) Division of application No. 16/518,865, filed on Jul. 22, 2019, now Pat. No. 11,383,971.

(30) Foreign Application Priority Data

Jul. 23, 2018 (IT) .......................... 102018000007442

(51) Int. Cl.
*B81B 7/00* (2006.01)
*B81C 1/00* (2006.01)
*H01L 29/66* (2006.01)

(52) U.S. Cl.
CPC .............. *B81B 7/007* (2013.01); *B81B 7/008* (2013.01); *B81C 1/0023* (2013.01); *B81C 2203/035* (2013.01); *H01L 29/66* (2013.01)

(58) Field of Classification Search
CPC ....... B81B 7/007; B81B 7/008; B81C 1/0023; B81C 1/00261
(Continued)

(56) References Cited

U.S. PATENT DOCUMENTS

2011/0084570 A1* 4/2011 Soeda .................... B06B 1/0292
310/300
2011/0115333 A1* 5/2011 Ezaki .................... B06B 1/0292
310/300

(Continued)

OTHER PUBLICATIONS

Lee, Hotaik et al., "Design of a Sparse Sub-array for Focused Ultrasound Surgery of Large Tumors," *IEEE International Ultrasonics Symposium Proceedings*, 2012, pp. 1165-1168.
(Continued)

*Primary Examiner* — Matthew E. Gordon
(74) *Attorney, Agent, or Firm* — Seed IP Law Group LLP

(57) ABSTRACT

A process for manufacturing MEMS devices, includes forming a first assembly, which comprises: a dielectric region; a redistribution region; and a plurality of unit portions. Each unit portion of the first assembly includes: a die arranged in the dielectric region; and a plurality of first and second connection elements, which extend to opposite faces of the redistribution region and are connected together by paths that extend in the redistribution region, the first connection elements being coupled to the die. The process further includes: forming a second assembly which comprises a plurality of respective unit portions, each of which includes a semiconductor portion and third connection elements; mechanically coupling the first and second assemblies so as to connect the third connection elements to corresponding second connection elements; and then removing at least part of the semiconductor portion of each unit portion of the second assembly, thus forming corresponding membranes.

20 Claims, 15 Drawing Sheets

(58) Field of Classification Search
USPC .......................................................... 257/684
See application file for complete search history.

(56) References Cited

U.S. PATENT DOCUMENTS

| | | | | |
|---|---|---|---|---|
| 2013/0115333 A1* | 5/2013 | Crosato | ................... | C12G 1/02 |
| | | | | 426/15 |
| 2013/0285166 A1* | 10/2013 | Classen | ............... | B81C 1/00134 |
| | | | | 438/51 |
| 2013/0307096 A1* | 11/2013 | Classen | ............... | B81C 1/00238 |
| | | | | 257/418 |
| 2014/0264660 A1* | 9/2014 | Rothberg | ................ | B81B 7/007 |
| | | | | 438/51 |
| 2015/0232329 A1* | 8/2015 | Classen | ................ | B23K 1/0016 |
| | | | | 228/256 |
| 2016/0009544 A1* | 1/2016 | Rothberg | ................ | H01L 24/94 |
| | | | | 257/737 |
| 2016/0009549 A1* | 1/2016 | Rothberg | ............ | B81C 1/00301 |
| | | | | 438/51 |
| 2017/0283254 A1 | 10/2017 | Rothberg et al. | | |
| 2018/0369862 A1* | 12/2018 | Alie | ................... | G01N 29/226 |

OTHER PUBLICATIONS

Park, Byoungyoul et al., "A Lorentz Force Actuated Continuous Deformable Polymer Mirror for Wavefront Control," Proceedigns, 1:554, 2017, 4 pages.

* cited by examiner

PROCESS FOR MANUFACTURING MICROELECTROMECHANICAL DEVICES, IN PARTICULAR ELECTROACOUSTIC MODULES

BACKGROUND

Technical Field

The present disclosure relates to a process for manufacturing microelectromechanical systems (MEMS) devices, and in particular electroacoustic modules.

Description of the Related Art

As is known, numerous ultrasonic sensors are today available, which are adapted to transmit and receive acoustic waves with frequencies higher than 20 kHz. Typically, an ultrasonic sensor comprises, in addition to a transducer of an electroacoustic type, a circuitry adapted to drive the transducer, as well as to amplify the electrical signals generated by the transducer itself following upon reception of echo acoustic signals. The transducer hence functions both as acoustic emitter and as acoustic receiver, in different periods of time.

If we designate as "stimulus acoustic signals" and as "response acoustic signals", respectively, the acoustic signals (or beams) transmitted by the transducer and the acoustic signals (or beams) that impinge on the transducer, for example following upon reflection of the stimulus acoustic signals by an obstacle, it is known that there is a desire, for example in the sonographic sector, to be able to focus the stimulus acoustic signals. In order to control emission in space of the stimulus acoustic signals, it is known to provide a plurality of transducers, each of which emits spherical acoustic waves, and control these transducers with driving signals appropriately phase-shifted with respect to one another, so that the sum of the stimulus acoustic signals generated by the transducers form an acoustic beam having the desired spatial distribution.

This being said, in order to increase the performance, in particular as regards amplification of the echo, the transducers, typically formed by corresponding MEMS devices arranged according to a matrix, are arranged as close as possible to the electronic circuitry, and in particular to the part of electronic circuitry having the function of amplifying the electrical signals generated by the transducers. However, this is difficult because of the high number of transducers (of the order of thousands) that are typically used.

In practice, since each transducer is coupled to a respective ASIC (Application-Specific Integrated Circuit), which forms the driving circuit and the receiver associated to the transducer, one should manage thousands of connections present between the transducers and the ASICs connected thereto, controlling the delays introduced by the different channels (each channel being understood as being formed by a transducer, by the corresponding driving circuit, and by the corresponding receiver), as well as the jitter present between the various channels.

This being said, currently known are manufacturing processes that envisage processing a first semiconductor wafer and a second semiconductor wafer, so as to form, in the first wafer, a plurality of transducers, and moreover so as to form, in the second wafer, a plurality of ASICs. Then, the first and second wafers are coupled together so that the transducers are coupled to the corresponding ASICs. This process, however, is characterized by a low flexibility, since it envisages adopting a single manufacturing technology both for the driving circuits and for the reception circuits. Moreover, this manufacturing process does not allow testing the ASICs, except once the process itself is through. Moreover, this manufacturing process requires that the pitch of the electrical-connection pads in the first wafer and in the second wafer should be the same.

BRIEF SUMMARY

An aim of the present disclosure is hence to provide a process for manufacturing MEMS devices that will overcome at least in part the drawbacks of the known art.

According to the present disclosure, a manufacturing process and a MEMS device are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
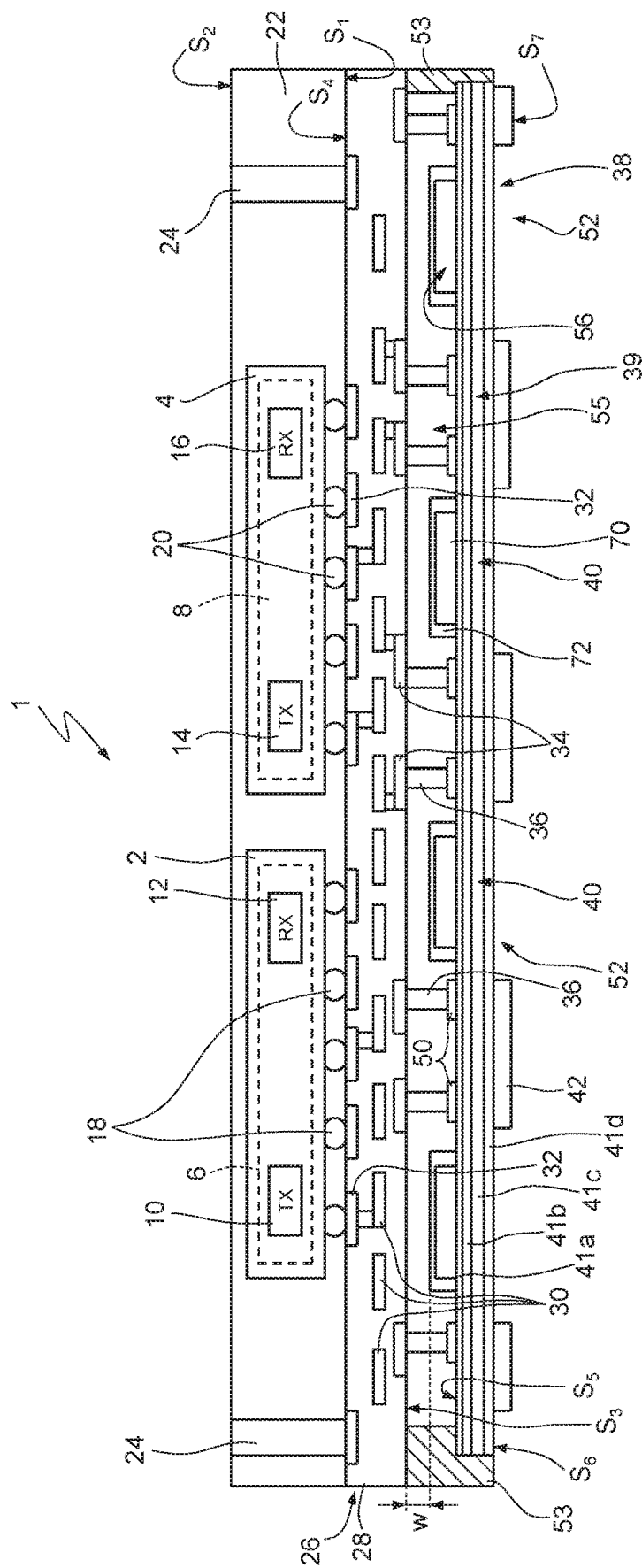
FIG. 1 is a schematic cross-sectional view of an electroacoustic module.

FIG. 1 shows an electroacoustic module 1, which comprises a first die 2 and a second die 4, formed inside which are, respectively, a first integrated circuit 6 and a second integrated circuit 8, formed, for example, by ASICs of a known type. Each of the first and second integrated circuits 6, 8 comprises a respective transmission circuit and a respective reception circuit, which are designated, respectively, by 10 and 12, in the case of the first integrated circuit 6, and by 14 and 16, in the case of the second integrated circuit 8.

Albeit not shown in detail, in each of the first and second integrated circuits 6, 8, the corresponding transmission and reception circuits are electrically connected to a corresponding plurality of metal bumps, designated, respectively, by 18 and 20 and also known as "microbumps". Once again in a way in itself known, the bumps 18, 20 are electrically connected to the so-called last-level metallizations of the corresponding dice.

The electroacoustic module 1 further comprises a coating region 22, which is made, for example, of an epoxy resin and englobes the first and second dice 2, 4, as well as part of the corresponding bumps 18, 20. The coating region 22 includes a first surface $S_1$ and a second surface $S_2$. The bumps 18, 20 of the first and second dice 2, 4 extend through the first surface $S_1$. Moreover, extending through the coating region 22 are a plurality of vertical connection regions 24 of the type known as "through-mold vias" (TMV), each of which is made of metal material and extends through the first surface $S_1$ and the second surface $S_2$.

The electroacoustic module 1 further comprises a redistribution structure 26, which comprises a dielectric region 28, a plurality of conductive paths 30 (represented qualitatively) and a plurality of inner pads 32 and outer pads 34.

The dielectric region 28 is made, for example, of polyimide (or else, for example, polyamide or a resin with glass fibers) and extends in contact with the first surface $S_1$. The dielectric region 28 has a third surface $S_3$ and a fourth surface $S_4$ that contacts the first surface $S_1$.

The inner pads 32 are made of metal material and extend through the first surface $S_1$ so as to contact corresponding bumps 18, 20 of the first die 2 or of the second die 4. The outer pads 34 are made of metal material and extend through the third surface $S_3$. Moreover, the conductive paths 30, which are made, for example, of the same metal material as that of the inner pads 32 and the outer pads 34 (for example, copper), connect each inner pad 32 to a corresponding outer pad 34, or else to a portion that extends through the first surface $S_1$ of a corresponding vertical connection region 24. In this regard, the portions that extend through the second surface $S_2$ of the vertical connection regions 24 are adapted to connect electrically to a PCB (Printed-Circuit Board), not shown.

The electroacoustic module 1 further comprises a plurality of pillars 36 made of metal material (for example, copper), which extend from the third surface $S_3$, in a direction perpendicular to the first, second, third, and fourth surfaces $S_1$, $S_2$, $S_3$, $S_4$. For example, each pillar 36 has a cylindrical shape. Moreover, each pillar 36 contacts, at a respective first end, a corresponding outer pad 34.

The electroacoustic module 1 further comprises a structure 38, which in what follows will be referred to as "transduction structure 38".

The transduction structure 38 comprises a multilayer region 39, which has a fifth surface $S_5$, which faces the third surface $S_3$, and a sixth surface $S_6$.

By way of example, the multilayer region 39 comprises a passivation layer 41a, a first dielectric layer 41b, a semiconductor layer 41c, and a second dielectric layer 41d, which are now described with reference to the orientation assumed by the electroacoustic module 1 in FIG. 1.

In detail, the passivation layer 41a forms the fifth surface $S_5$ and is made, for example, of silicon nitride. Moreover, the first dielectric layer 41b extends underneath the passivation layer 41a, with which it is in direct contact, and is made, for example, of silicon oxide. The semiconductor layer 41c extends underneath the first dielectric layer 41b, with which it is in direct contact. The second dielectric layer 41d is made, for example, of silicon oxide. Moreover, the second dielectric layer 41d extends underneath the semiconductor layer 41c, with which it is in direct contact, and forms the sixth surface $S_6$.

The transduction structure 38 further comprises a semiconductor region 42, which in what follows will be referred to as "undeformable region 42".

In detail, the undeformable region 42 extends underneath the second dielectric layer 41d, with which it is in direct contact. Moreover, the undeformable region 42 is delimited at the bottom by a seventh surface $S_7$ and laterally delimits a plurality of recesses 52.

In greater detail, each recess 52 has, for example, a cylindrical shape. Moreover, the portions of the multilayer region 39 that define the tops of corresponding recesses 52 function as membranes (designated by 40), whereas the undeformable region 42 functions as undeformable frame, to which the membranes are fixed.

Without this implying any loss of generality, in FIG. 1 four membranes 40 are shown. The undeformable region 42 has, for example, a rectangular envelope, in top plan view. The membranes 40 may have a thickness, for example, of between 5 μm and 7 μm.

The fifth surface $S_5$ carries a plurality of pads 50 made of metal material, which will be referred to as "driving pads 50". In particular, each driving pad 50 extends on the passivation layer 41a so as to contact a corresponding pillar 36. In other words, each pillar 36 is interposed between a corresponding outer pad 34 and a corresponding driving pad 50.

The electroacoustic module 1 further comprises a sealing region 53, which is made, for example, of benzocyclobuthene (BCB) and extends between the multilayer region 39 and the dielectric region 28 of the redistribution structure 26 so as to delimit laterally a closed cavity 55, which is moreover delimited by the fourth and fifth surfaces $S_4$, $S_5$. The pillars 36 extend inside the closed cavity 55.

The electroacoustic module 1 further comprises a plurality of actuators 56. By way of example, the electroacoustic module 1 comprises one actuator 56 for each membrane 40. Each actuator 56 extends in the closed cavity 55, in contact with the corresponding membrane 40.

In greater detail, each actuator 56 comprises a respective piezoelectric region 70 and a respective protective region 72, as well as a pair of electrodes (not shown), electrically connected to corresponding driving pads 50. The protective region 72 overlies the piezoelectric region 70 and may be made, for example, of the same material as that of the passivation layer 41a, with which it may form, for example, a single monolithic region, which englobes the piezoelectric region 70 and the corresponding electrodes. Moreover, between the protective region 72 and the third surface $S_3$ there is a distance w for example of between 3 μm and 5 μm.

As mentioned previously, and without this implying any loss of generality, each actuator 56 is electrically coupled to a pair of driving pads 50 and is hence electrically coupled to a pair of corresponding bumps of the first die 2 or second die 4. In particular, this electrical coupling is obtained through corresponding pillars 36, as well as through corresponding outer pads 34, corresponding conductive paths 30, and corresponding inner pads 32. In this way, if we assume, for example, that the actuator 56 is connected to the first die 2, it is able, in first time intervals, to receive electrical control signals generated by the transmission circuit 10 of the first die 2, which cause corresponding deformations of the membrane 40 mechanically coupled to this actuator 56, with consequent generation of an acoustic wave. Moreover, in second time intervals, different from the first time intervals, the deformation of the membrane 40, due, for example, to an acoustic echo signal impinging thereon, causes a corresponding deformation of the transducer 56, which generates an electrical response signal that is received by the reception circuit 12 of the first die 2, which can process it and then supply a corresponding output signal to an external computer (not shown), through corresponding vertical connection regions 24.

In other words, a part of the actuators 56, and hence of the corresponding membranes 40, is electrically coupled to the first die 2, whereas another part of the actuators 56, and hence of the corresponding membranes 40, is electrically coupled to the second die 4. Without this implying any loss of generality, each membrane 40 is connected both to the transmission circuit and to the reception circuit of the corresponding die. Moreover, once again without this implying any loss of generality, in the die there may be implemented mechanisms of protection of the reception circuit, during transmission; alternatively, the transmission and reception signals can be carried to/from the membrane 40 through two different pillars 36, in which case the membrane 40 functions as protection element.

This being said, the electroacoustic module 1 can be manufactured according to the process described in what follows.

Figure 2:
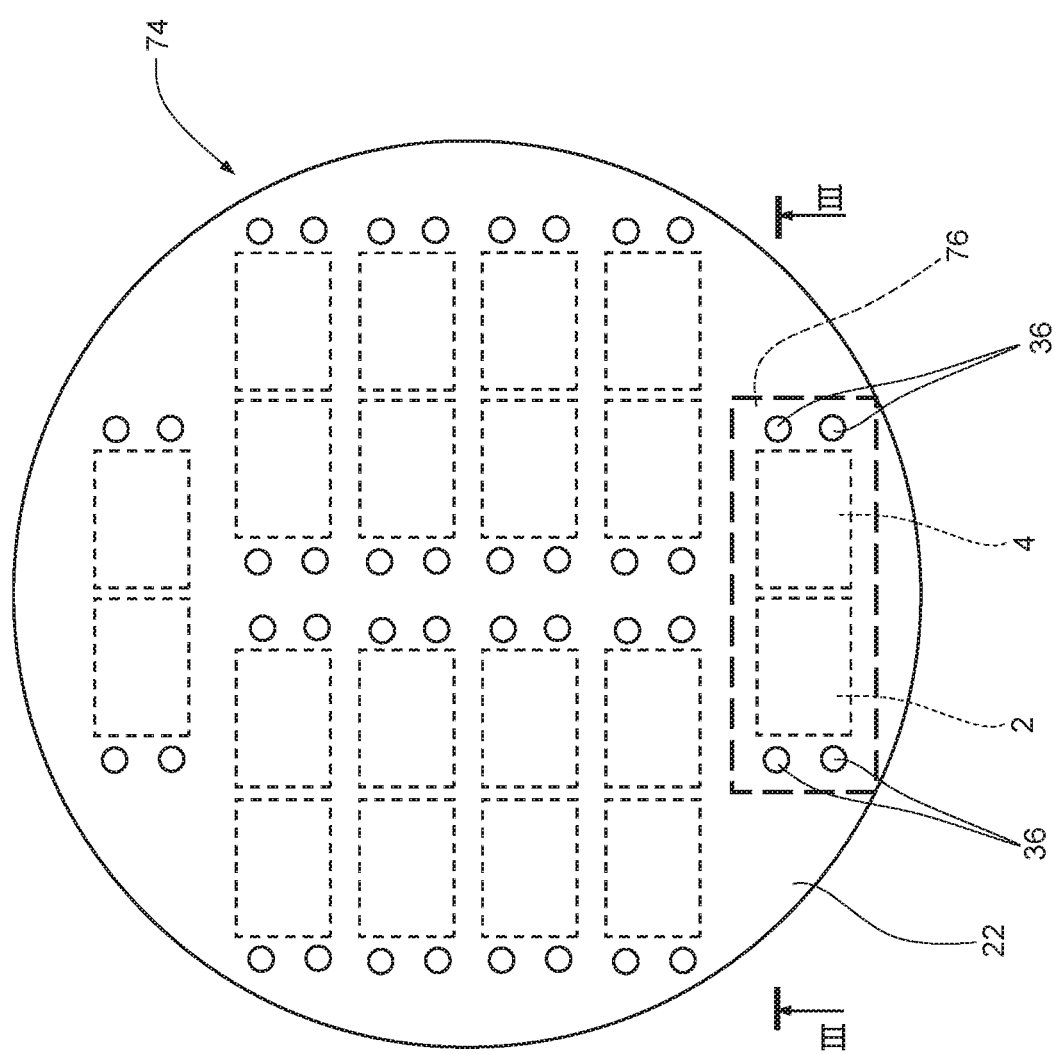
FIG. 2 is a schematic top plan view with portions removed of a reconstructed wafer.

Initially, as shown in FIG. 2, an assembly 74 is formed, which in what follows will be referred to as "ASIC assembly 74", for reasons that will be clarified hereinafter. The ASIC assembly 74 includes a plurality of unit portions 76 that are the same as one another and are laterally spaced apart (only one is labeled as unit portion 76 in FIG. 2, but ten unit portions are shown); the term "unit" regards precisely the fact that these portions represent units (or equivalently, basic portions) that are the same as one another and that repeat in space.

Figure 3:
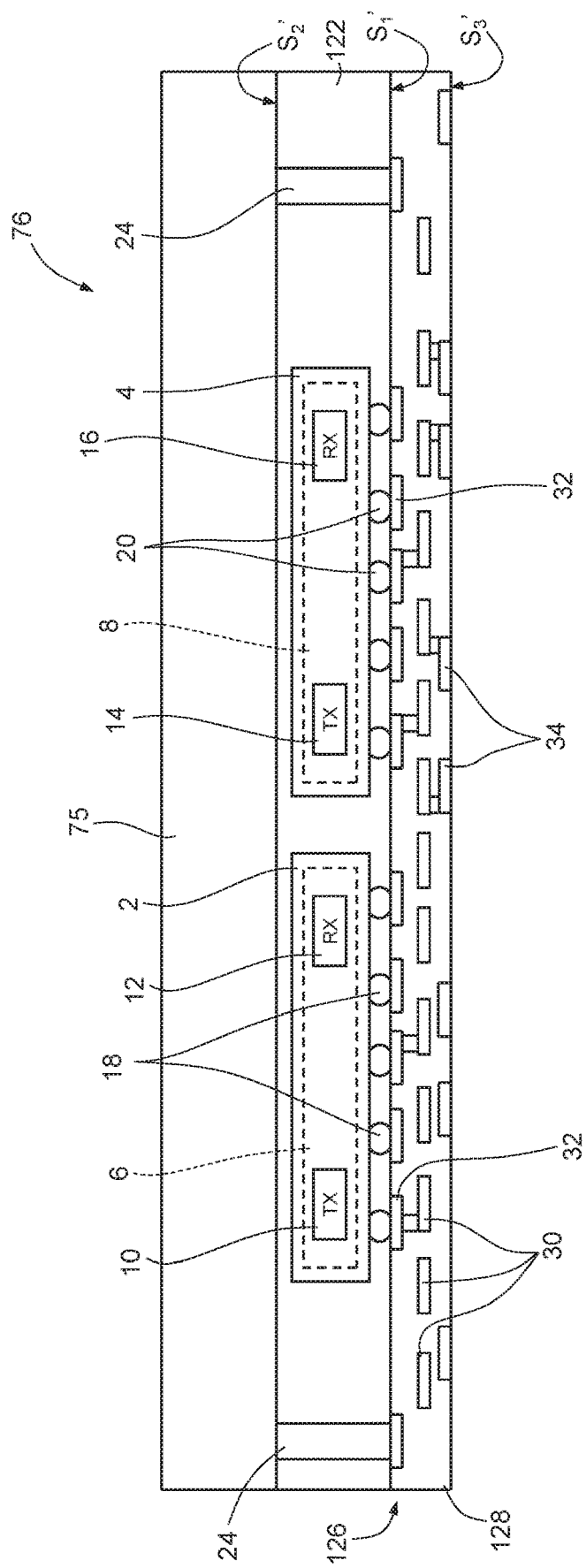
FIG. 3 is a schematic cross-sectional view of a portion of the reconstructed wafer shown in FIG. 2, taken along a line of section III-III shown in FIG. 2.

In detail, a unit portion 76 is shown in FIG. 3 and is described in what follows, limitedly to the differences with respect to what is shown in FIG. 1. Moreover, elements already shown in FIG. 1 are designated by the same reference numbers, except where otherwise specified.

In greater detail, the unit portion 76 is the same as the part of the electroacoustic module 1 that extends between the third surface $S_3$ and the first surface $S_1$, as shown in FIG. 1, but for the differences outlined below.

The coating region, here designated by 122, is shared by the unit portions 76 of the ASIC assembly 74; i.e., it forms a single region of the ASIC assembly 74. Also the dielectric region of the redistribution structure (these elements being here designated, respectively, by 128 and 126, and being referred to in what follows, respectively, as "assembly dielectric region 128" and "assembly redistribution structure 126") is shared by the unit portions 76 of the ASIC assembly 74. Moreover, the first, second, and third surfaces are shared by the unit portions 76 of the ASIC assembly 74; i.e., they each represent a portion of a first wafer surface $S_1'$, a second wafer surface $S_2'$, and a third wafer surface $S_3'$, respectively.

In addition, extending on the unit portion 76 is a support 75 (not shown in FIG. 2), made, for example, of glass, which is shared by the unit portions 76 of the ASIC assembly 74.

Without this implying any loss of generality, manufacture of the ASIC assembly 74 may be carried out in a way in itself known, by means of so-called machining techniques of a FOWLP (Fan-Out Wafer-Level Package) type. In this connection, the first and second dice 2, 4 of the unit portions 76 may be manufactured in a way in itself known, adopting so-called wafer-level manufacturing technologies, which enable to precisely manufacture, starting from one and the same semiconductor wafer (not shown), a plurality of dice, and then separation (singulation) of these dice, by means of dicing operations. After a possible testing step, the dice thus formed are again mechanically coupled, through coupling with the assembly redistribution structure 126, so as to form precisely the ASIC assembly 74.

In practice, the ASIC assembly 74 is formed by an assembly of dice fixed together, after they have been previously singulated, so that this assembly has to a first approximation the shape of a wafer, in the sense that it can be superimposed on top of a semiconductor wafer appropriately processed, as described hereinafter. In other words, the ASIC assembly 94 represents a sort of reconstructed wafer. Moreover, the dice of the ASIC assembly 74 share a single redistribution structure, formed precisely by the assembly redistribution structure 126.

Figure 4:
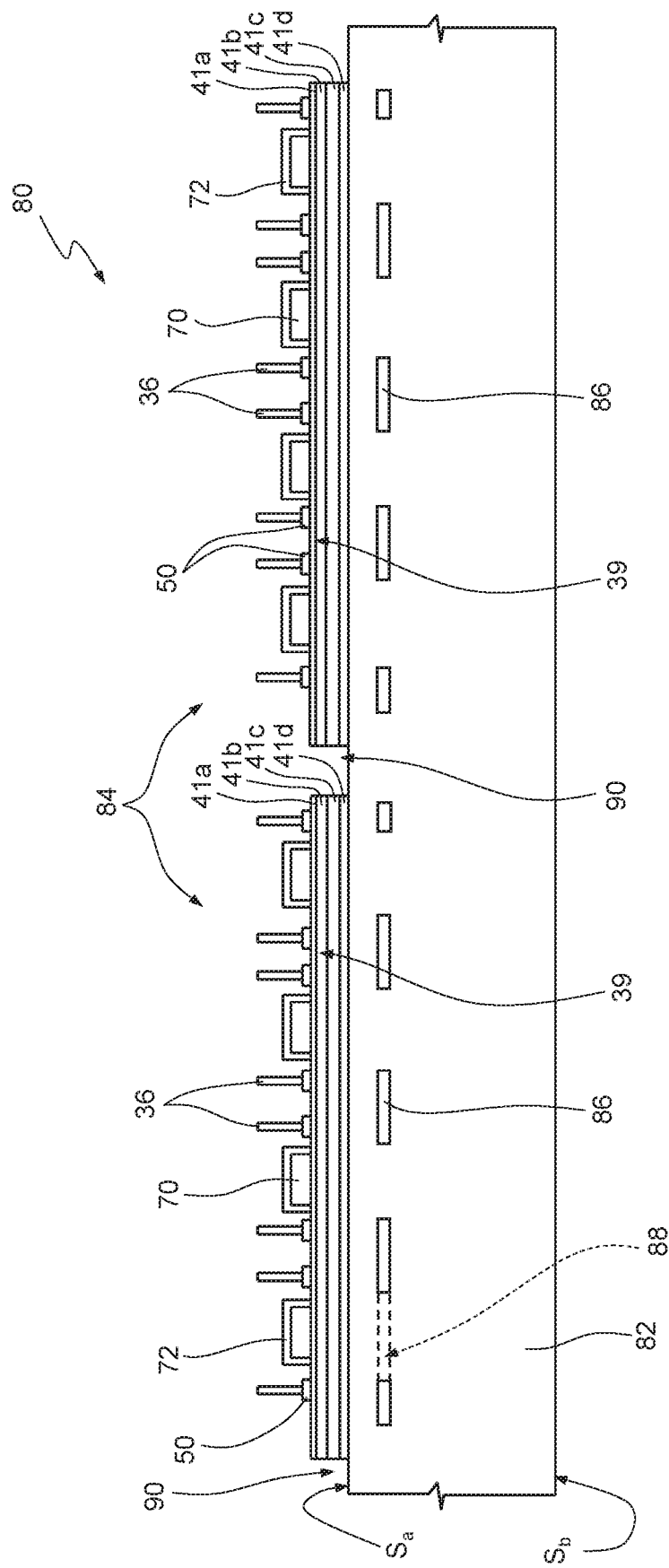
FIG. 4 is a schematic cross-sectional view of a semiconductor wafer during a step of the present manufacturing process.

The present manufacturing process moreover envisages processing of a wafer 80 of semiconductor material, shown in FIG. 4, which in what follows will be referred to as "MEMS wafer 80".

In detail, the MEMS wafer 80 comprises a single semiconductor body 82, delimited by a top surface $S_a$ and a bottom surface $S_b$ (the terms "top" and "bottom" refer to the orientation assumed by the MEMS wafer 80 in FIG. 4).

Extending over the top surface $S_a$ are a plurality of respective unit portions 84 (two of which are shown in FIG. 4), which are the same as one another. Moreover, each unit portion 84 is the same as the transduction structure 38, except for the differences described hereinafter. In particular, the unit portion 84 is without the undeformable region 42 and extends over the semiconductor body 82 so that the respective second dielectric layer 41d extends on the top surface $S_a$. Moreover, each unit portion 84 comprises a plurality of corresponding pillars 36, which contact corresponding driving pads 50.

Once again with reference to the MEMS wafer 80, extending inside the semiconductor body 82 is a plurality of buried dielectric regions 86 (one for each unit portion 84), made, for example, of silicon oxide. Without this implying any loss of generality, the MEMS wafer 80 comprises a number of buried dielectric regions 86 equal to the number of unit portions 84, which extend at a distance from the top surface $S_a$; moreover, each buried dielectric region 86 laterally delimits a number of cavities 88 (just one of which is represented by a dashed line in FIG. 4) equal to the number of membranes 40 of the electroacoustic module 1, which in what follows will be referred to as "filled cavities 88", since they are filled by corresponding portions of the semiconductor body 82.

As may be seen once again in FIG. 4, the unit portions 84 are mutually spaced apart laterally on the underlying semiconductor body 82, so that the multilayer regions 39 of the unit portions 84 laterally delimit a cavity 90, which in what follows will be referred to as "wafer cavity 90". The wafer cavity 90 is delimited at the bottom by the top surface $S_a$ of the semiconductor body 82.

Figure 5:
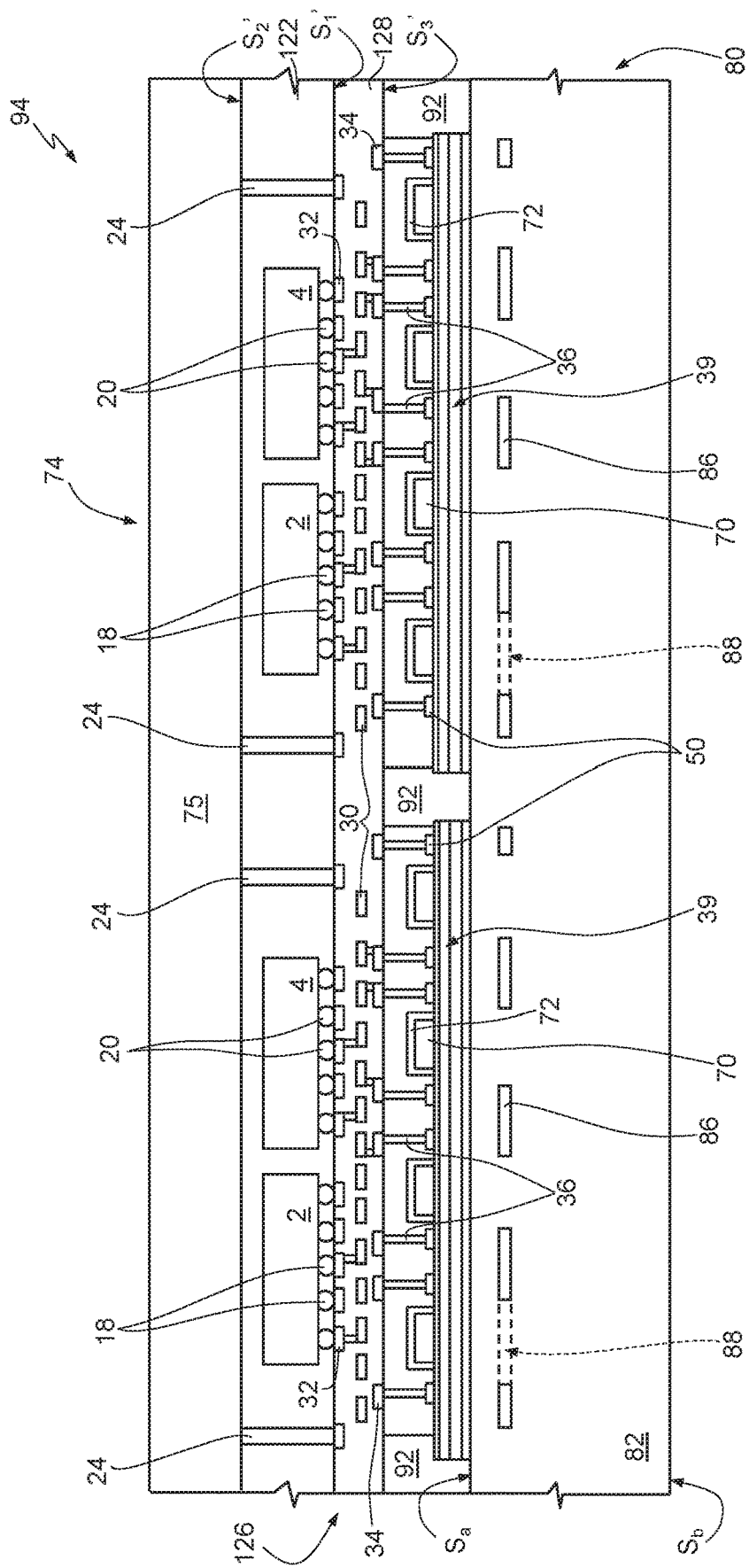
FIGS. 5-9 are schematic cross-sectional views of a multiwafer assembly, during successive steps of the present manufacturing process.

Next, as shown in FIG. 5, the ASIC assembly 74 and the MEMS wafer 80 are mechanically and electrically coupled together so as to couple each unit portion 84 of the MEMS wafer 80 to a corresponding unit portion 76 of the ASIC assembly 74. In particular, the pillars 36 of each unit portion 84 of the MEMS wafer 80 are soldered to the outer pads 34 of a corresponding unit portion 76 of the ASIC assembly 74.

In addition, before or after mechanical coupling of the ASIC assembly 74 with the MEMS wafer 80, the wafer cavity 90 is filled with a bonding region 92, which hence extends in contact with the top surface $S_a$ of the semiconductor body 82. Moreover, the bonding region 92, made, for example, of benzocyclobutene (BCB), extends until it comes into contact with the third wafer surface $S_3'$, so as to bond the top surface $S_a$ of the semiconductor body 82 to the assembly dielectric region 128 of the assembly redistribution structure 126. The ASIC assembly 74 and the MEMS wafer 80 thus form a multiwafer assembly 94.

In greater detail, in the case where the bonding region 92 is formed prior to mechanical coupling between the ASIC assembly 74 and the MEMS wafer 80, the bonding region 92 is deposited in a selective way on the top surface $S_a$ of the semiconductor body 82, according to a pre-set pattern; alternatively, as mentioned previously, the bonding region 92 can be injected after the ASIC assembly 74 and the MEMS wafer 80 have been coupled together.

Figure 6:
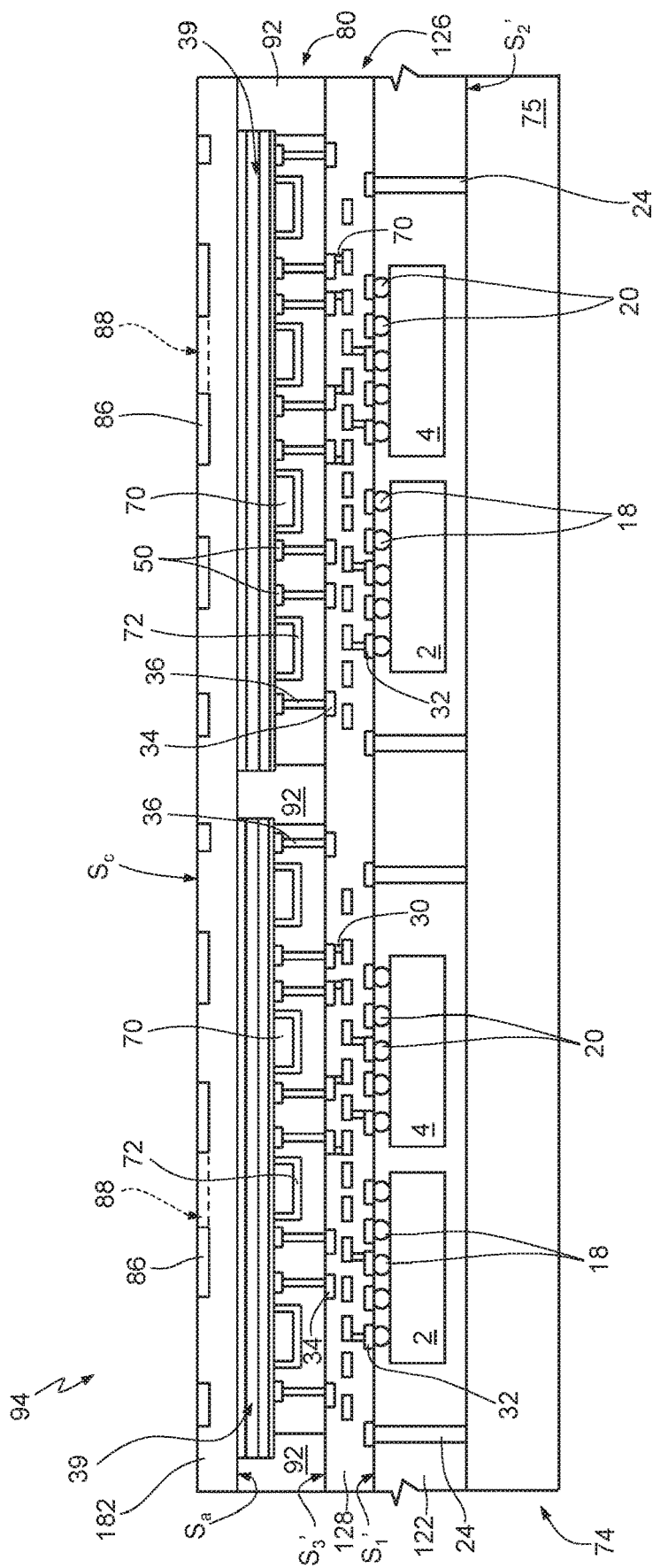

Next, as shown in FIG. 6, a mechanical lapping of the semiconductor body 82 is carried out, starting from the bottom surface $S_b$, so as to expose the buried dielectric regions 86. Without this implying any loss of generality, this lapping operation may take place after the multiwafer assembly 94 has been arranged as shown precisely in FIG. 6, i.e., so that the support 75 is arranged at the bottom. The remaining portion of the semiconductor body, designated by 182, is delimited by a surface $S_c$, which in what follows will be referred to as "intermediate surface $S_c$". The buried dielectric regions 86 and the filled cavities 88 hence give out onto the intermediate surface $S_c$.

Figure 7:
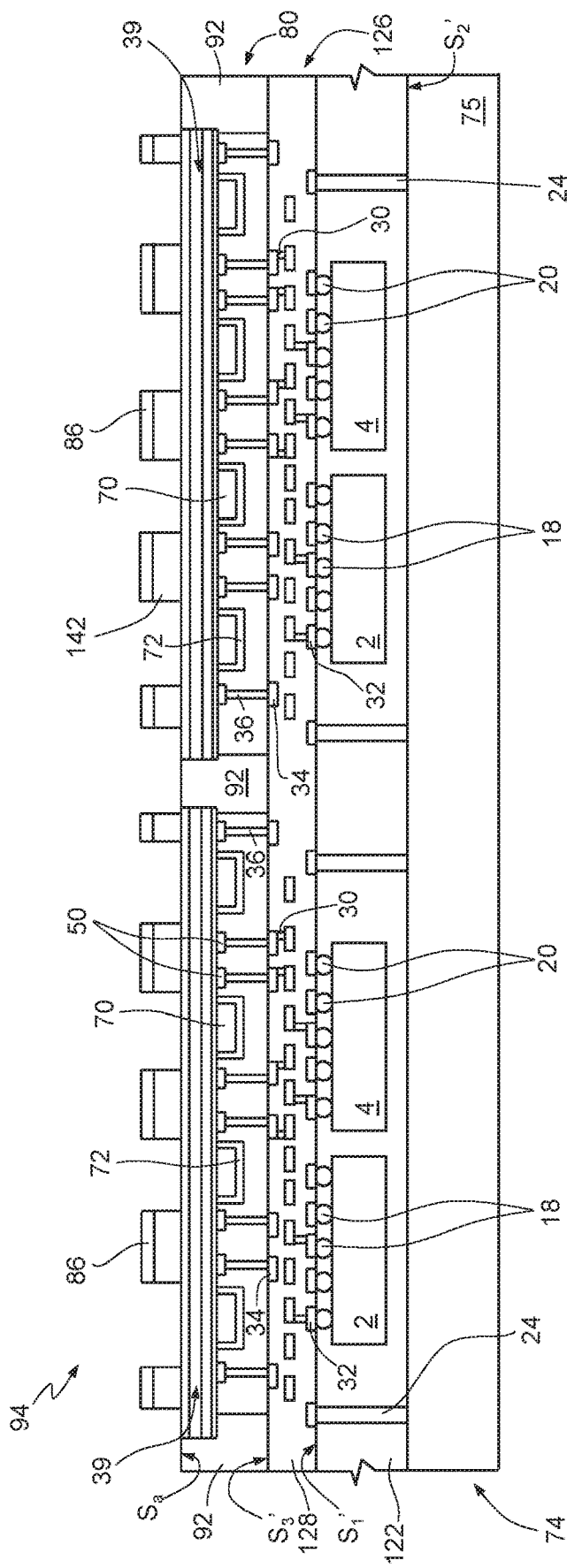

Next, as shown in FIG. 7, a photolithographic process is carried out, in which the buried dielectric regions 86, now exposed, function as hard mask. In this way, first portions of semiconductor material, which extend in the filled cavities 88, as well as corresponding second portions of semiconductor material, arranged between the first portions of semiconductor material and the top surface $S_a$, are selectively removed. The remaining portions of the semiconductor body 182 form a wafer semiconductor region 142, designed to form, following upon dicing operations described hereinafter, the undeformable regions 42 of a plurality of electroacoustic modules. The aforementioned photolithographic process moreover entails that the bonding region 92 is exposed.

Following upon the aforementioned photolithographic process, carried out simultaneously on the entire MEMS wafer 80, portions of each multilayer region 39, which form the aforementioned membranes 40, are exposed. In practice, the operations illustrated in FIGS. 6 and 7 represent so-called back-end operations and entail release of the membranes 40.

Figure 8:
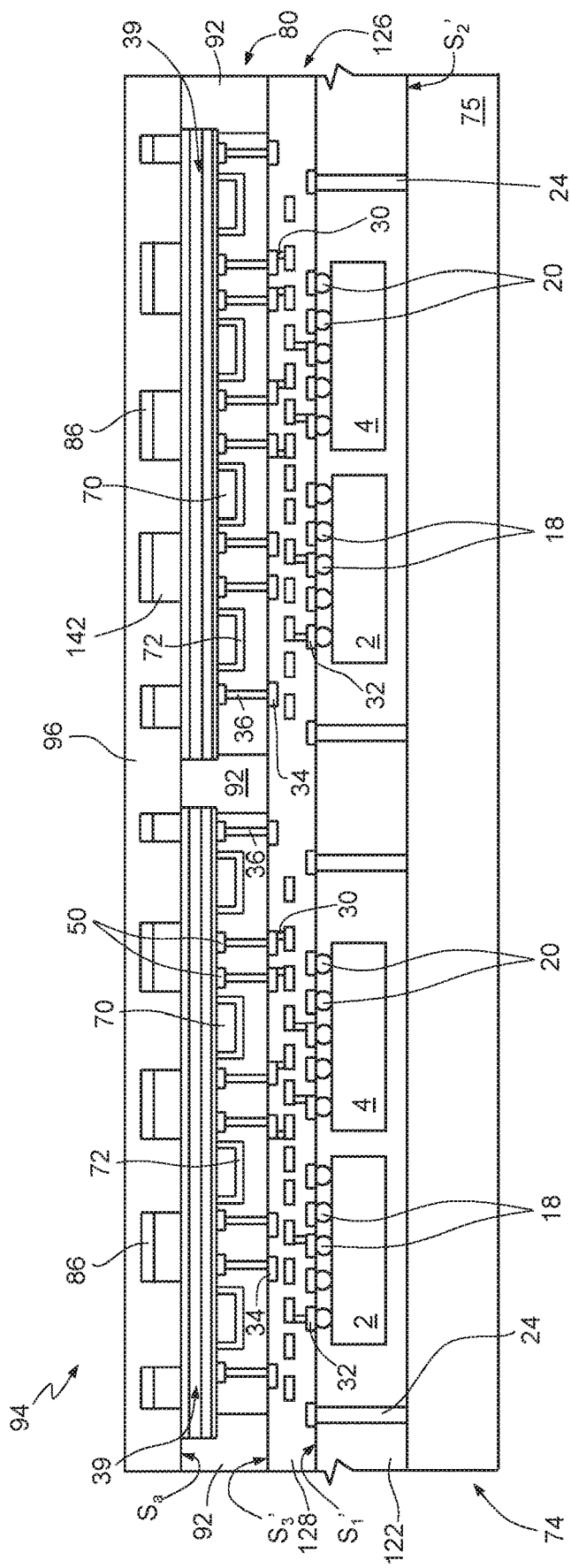

Next, as shown in FIG. 8, formed on the MEMS wafer 80 is a covering region 96, made, for example, of an epoxy resin, which covers, inter alia, the exposed portions of the buried dielectric regions 86, of the wafer semiconductor region 142, and of the second dielectric layers 41*d*.

Figure 9:
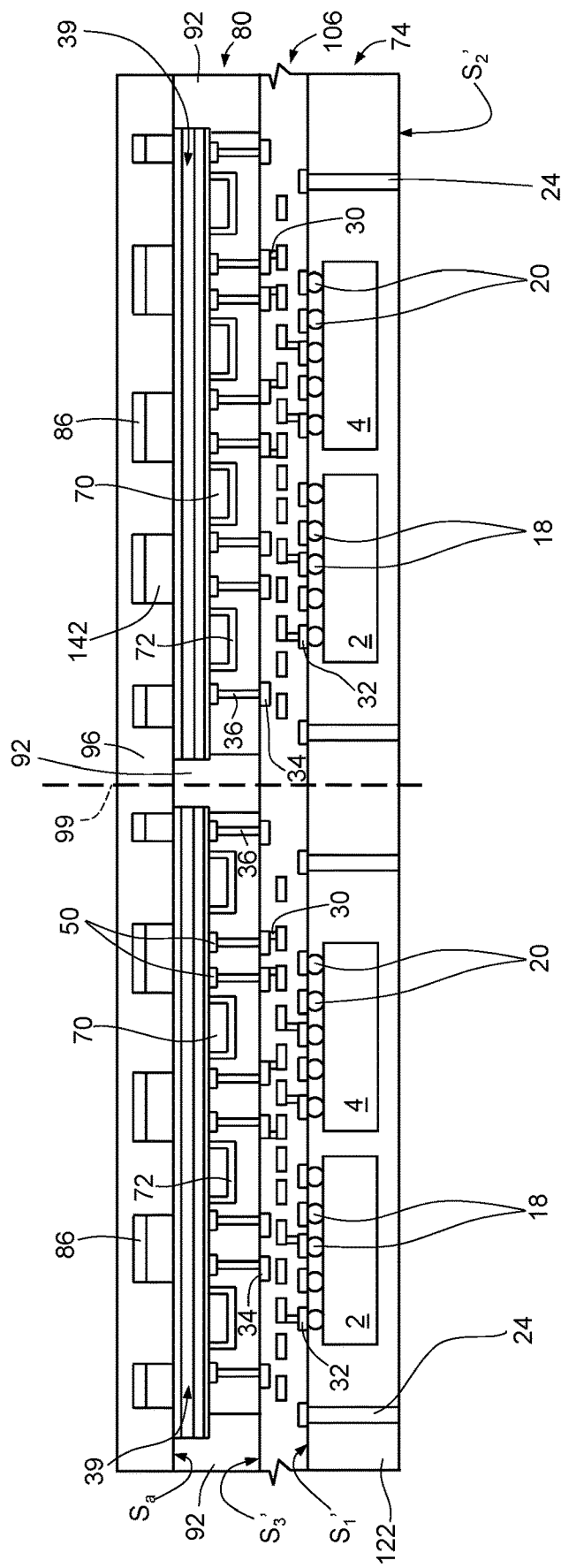

Next, as shown in FIG. 9, the support 75 is removed and a dicing operation is then carried out, along scribe lines 99 (represented schematically with a dashed line), which entails a so-called singulation, starting from the multiwafer assembly 94, of a plurality of devices 101, each of which is the same as the electroacoustic module 1 shown in FIG. 1, but for the presence of the buried dielectric regions 86, not shown in FIG. 1. The cut portions of the bonding region 92 form corresponding sealing regions 53 (FIG. 1).

According to a variant of the manufacturing process, an assembly 110 (shown in FIG. 10) is formed, which in what follows will be referred to as the multi-die assembly 110. The multi-die assembly 110 is now described with reference to the differences with respect to the MEMS wafer 80 shown in FIG. 4.

Figure 10:
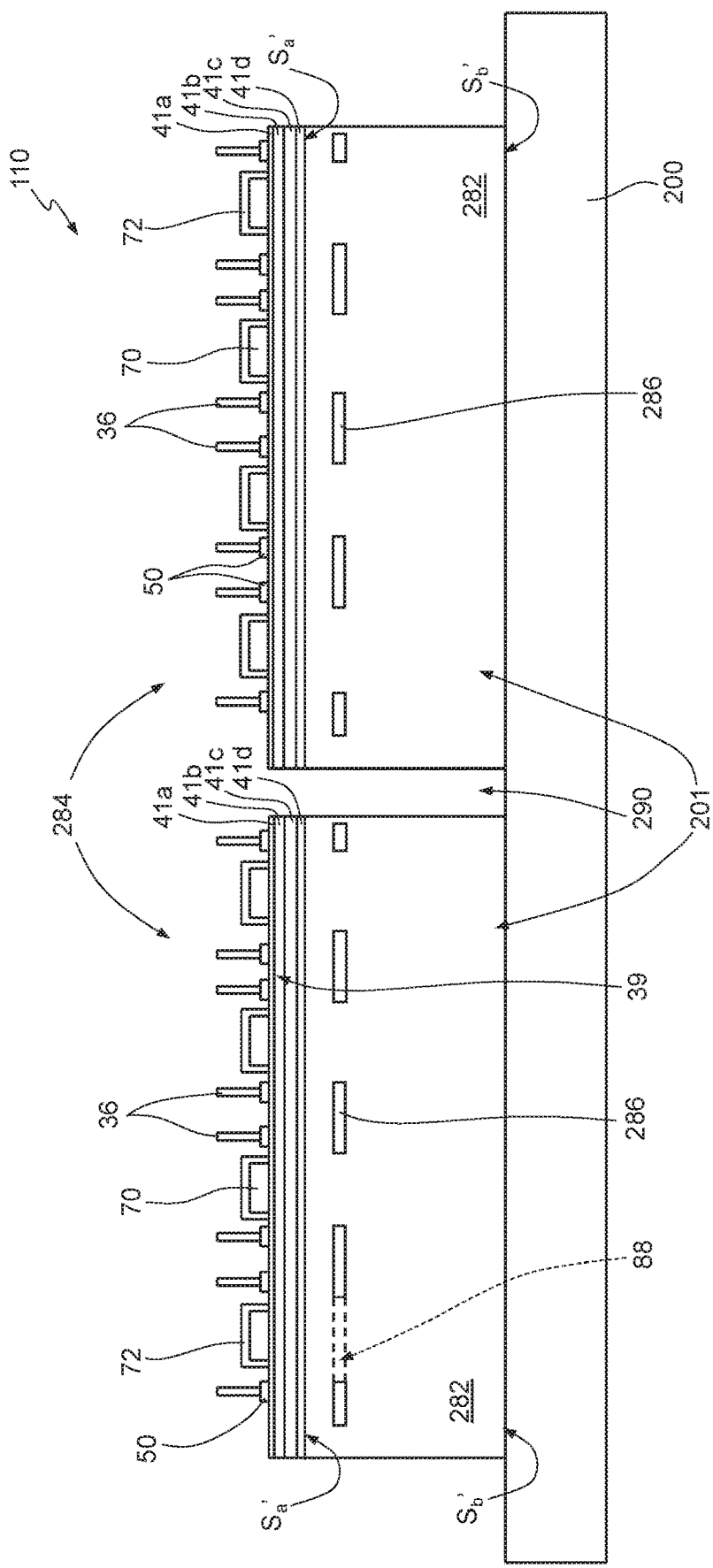
FIG. 10 is a schematic cross-sectional view of an assembly including a plurality of dice, during a step of a variant of the present manufacturing process.

In detail, the multi-die assembly 110 comprises a plurality of semiconductor bodies, designated by 282 (two of which are shown in FIG. 10), each of which carries a corresponding unit portion (here designated by 284). Extending inside each semiconductor body 282 is a corresponding buried dielectric region (designated by 286). The top and bottom surfaces that delimit each semiconductor body 282 are designated, respectively, by $S_a'$ and $S_b'$.

The multi-die assembly 110 further comprises a support 200, formed, for example, by a tape of adhesive material, resting on which are the bottom surfaces $S_b'$ of the semiconductor bodies 282. In practice, each semiconductor body 282 forms, together with the corresponding unit portion 284, a corresponding die, which is carried by the support 200, and which in what follows will be referred to as "transduction die 201". The transduction dice 201 are laterally staggered with respect to one another so as to delimit laterally an inter-die cavity 290.

Figure 11:
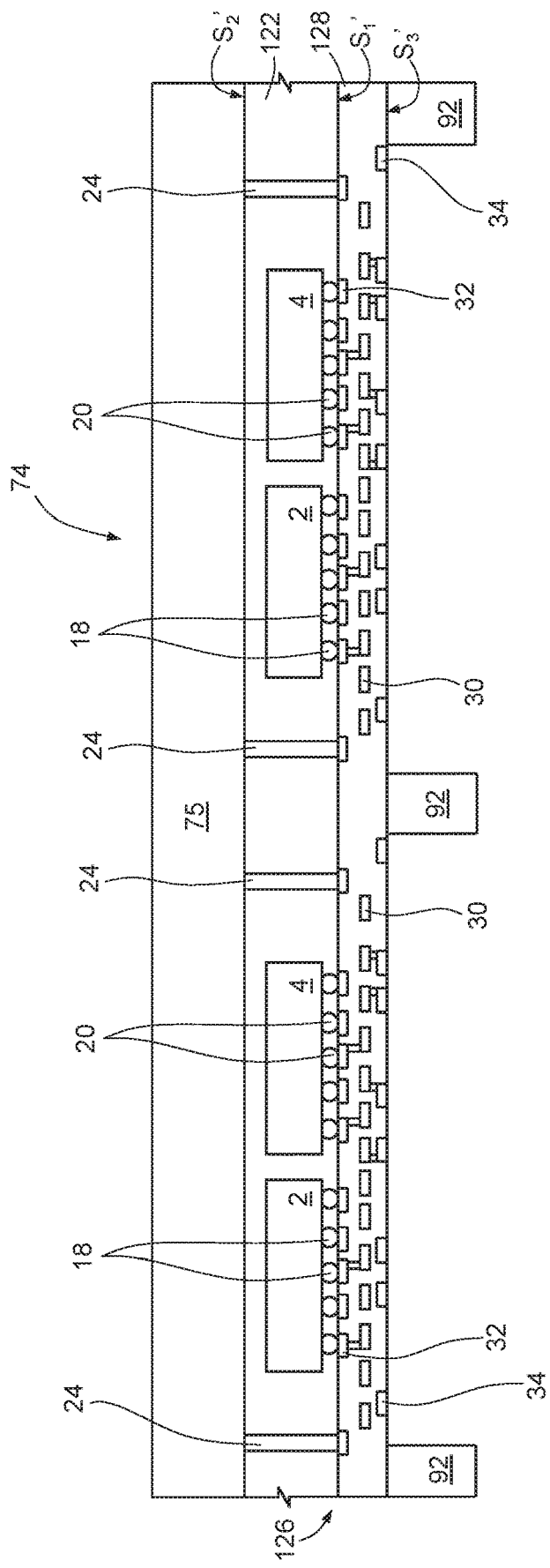
FIG. 11 is a schematic cross-sectional view of a portion of reconstructed wafer.

As shown in FIG. 11, on the third wafer surface $S_3'$ of the ASIC assembly 74, the bonding region 92 is formed, for example by means of a localized injection process.

Figure 12:
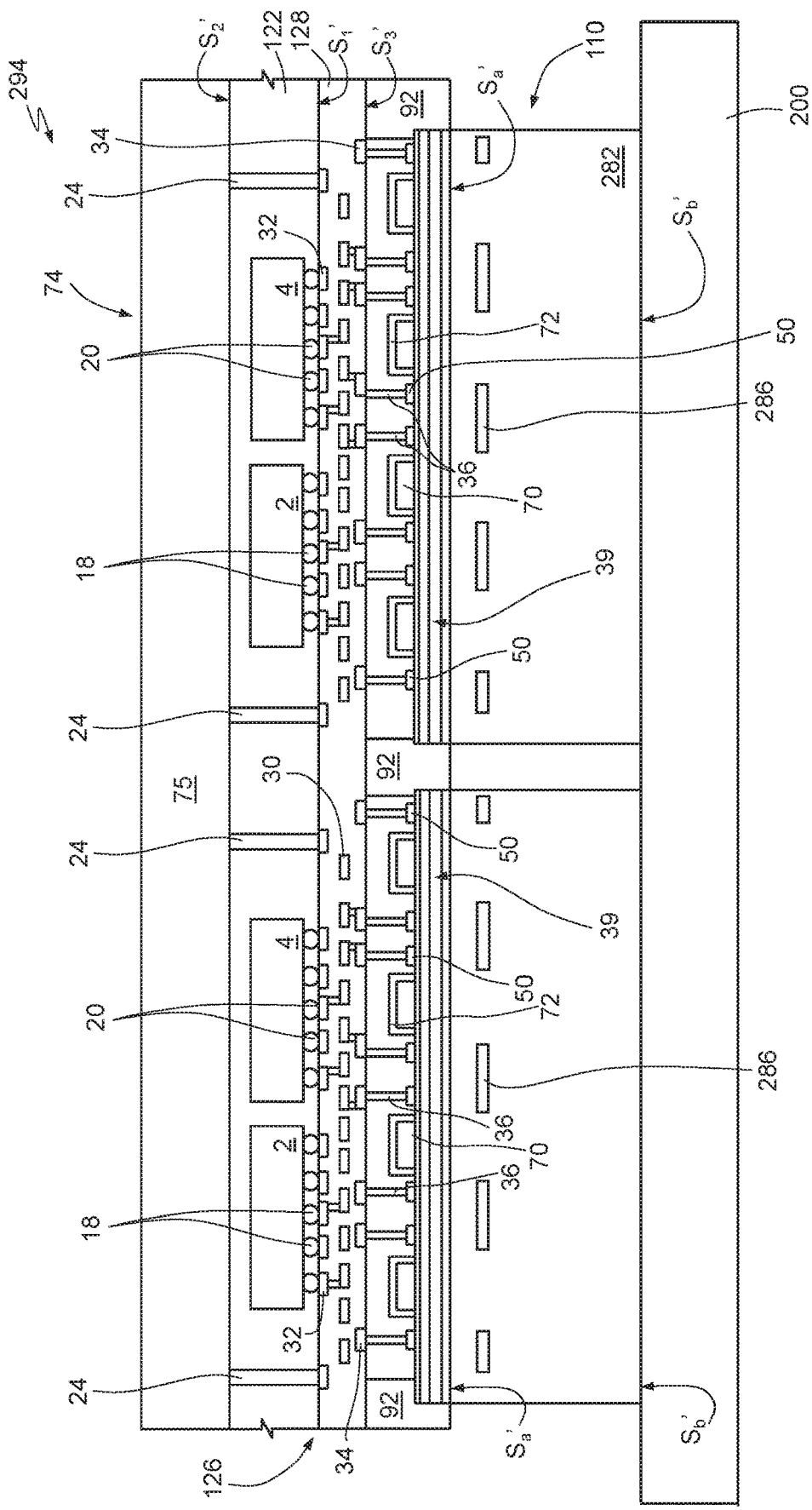
FIGS. 12-15 are schematic cross-sectional views of a wafer-dice assembly, during successive steps of the variant of the present manufacturing process.

Next, as shown in FIG. 12, the multi-die assembly 110 and the ASIC assembly 74 are mechanically and electrically coupled so as to form an assembly 294, which in what follows will be referred to as "wafer-dice assembly 294".

Figure 13:
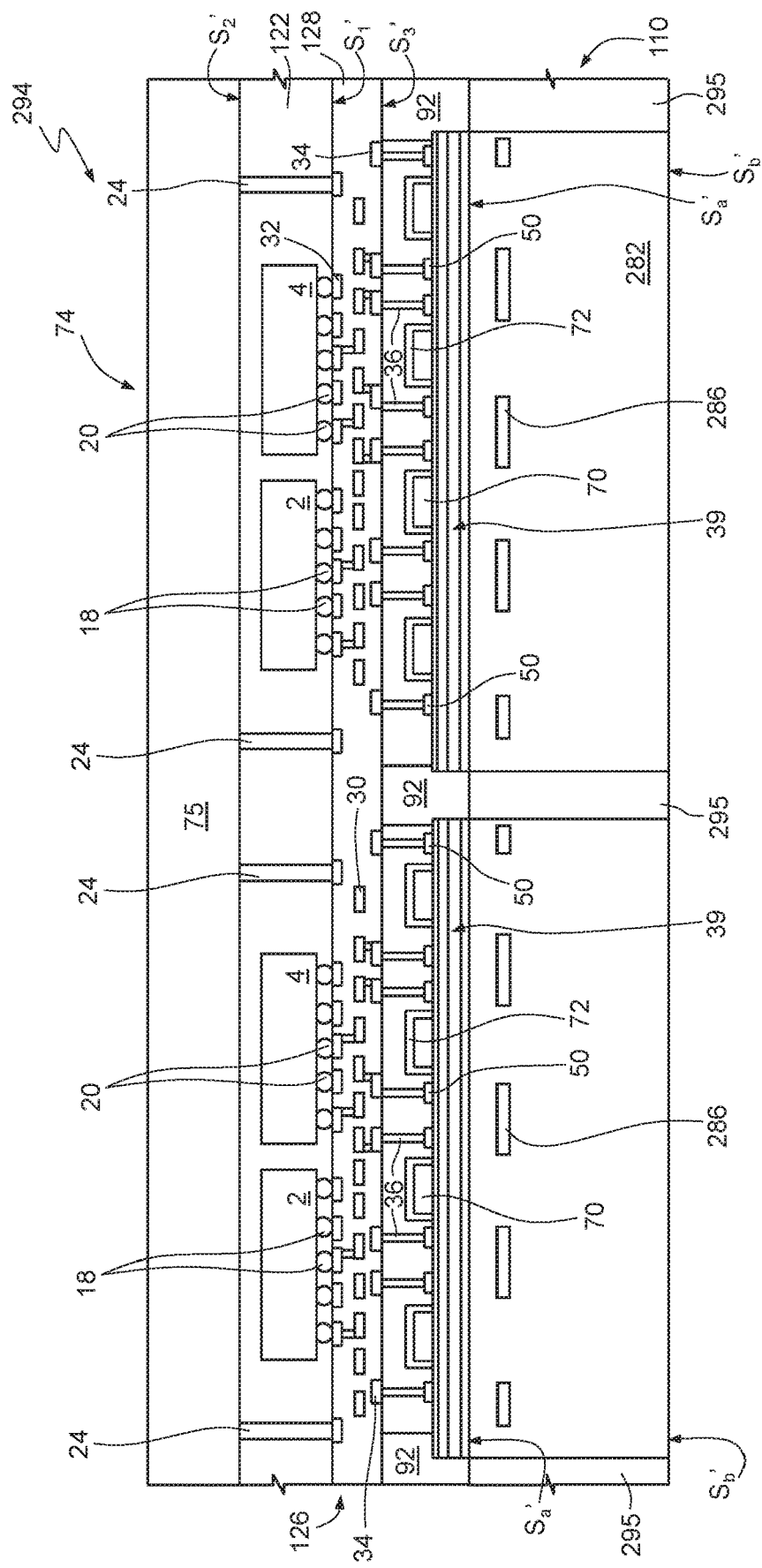

Then, as shown in FIG. 13, the support 200 is removed. Moreover, an interstitial region 295 (optional) may be formed, for example by carrying out a process of injection of an epoxy resin. In particular, the interstitial region 295 fills the gaps present between the semiconductor bodies 282, and is hence laterally delimited by the latter. Moreover, the interstitial region 295 contacts the bonding region 92.

Figure 14:
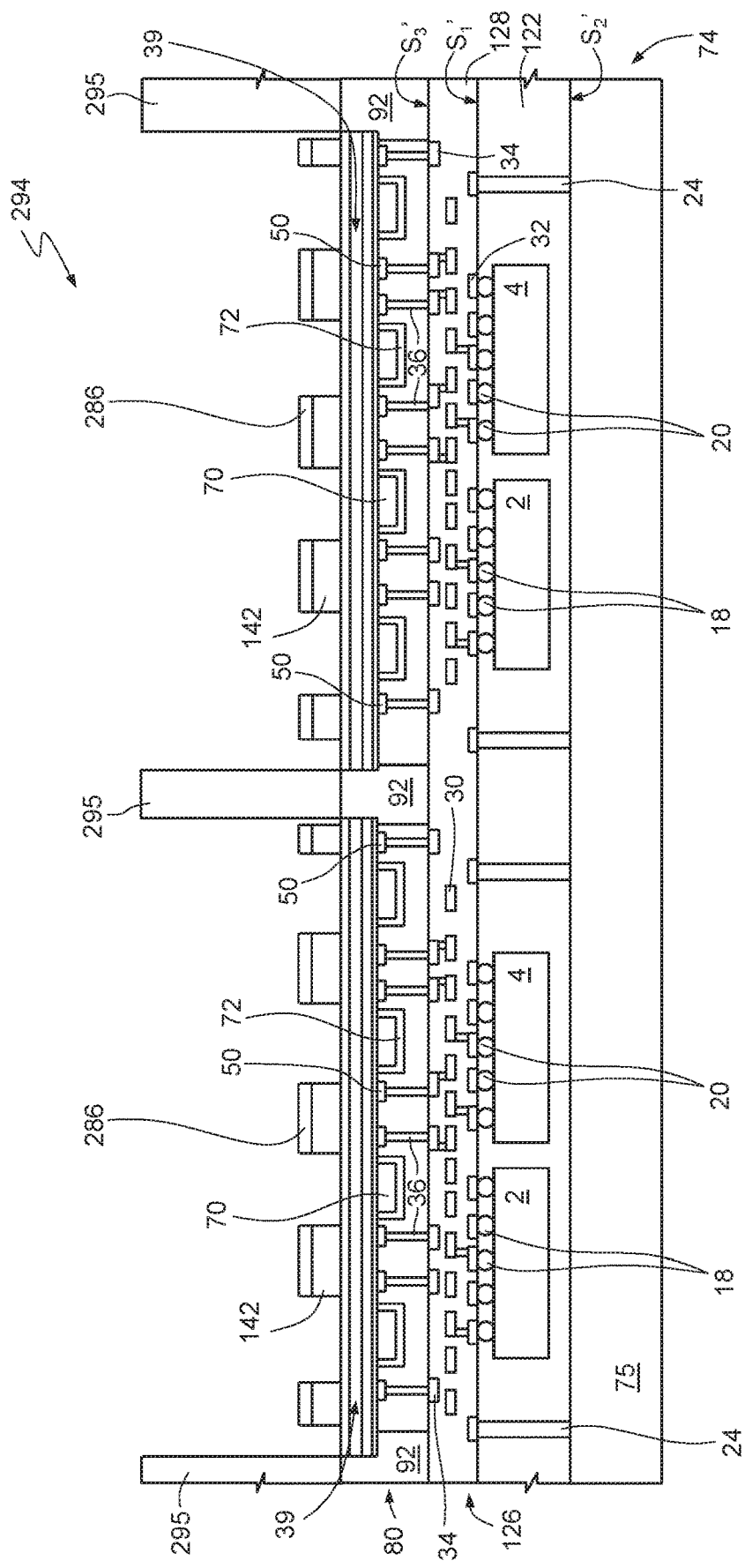

Next, as shown in FIG. 14, the wafer-dice assembly 294 is arranged with the support 75 at the bottom and the semiconductor bodies 282 at the top. In addition, the operations described with reference to FIGS. 6 and 7 are carried out. In other words, the semiconductor bodies 282 are mechanically lapped in order to expose the respective buried dielectric regions 286 so that they can function as hard mask for the subsequent photolithographic process that leads to formation of the undeformable regions 42.

Figure 15:
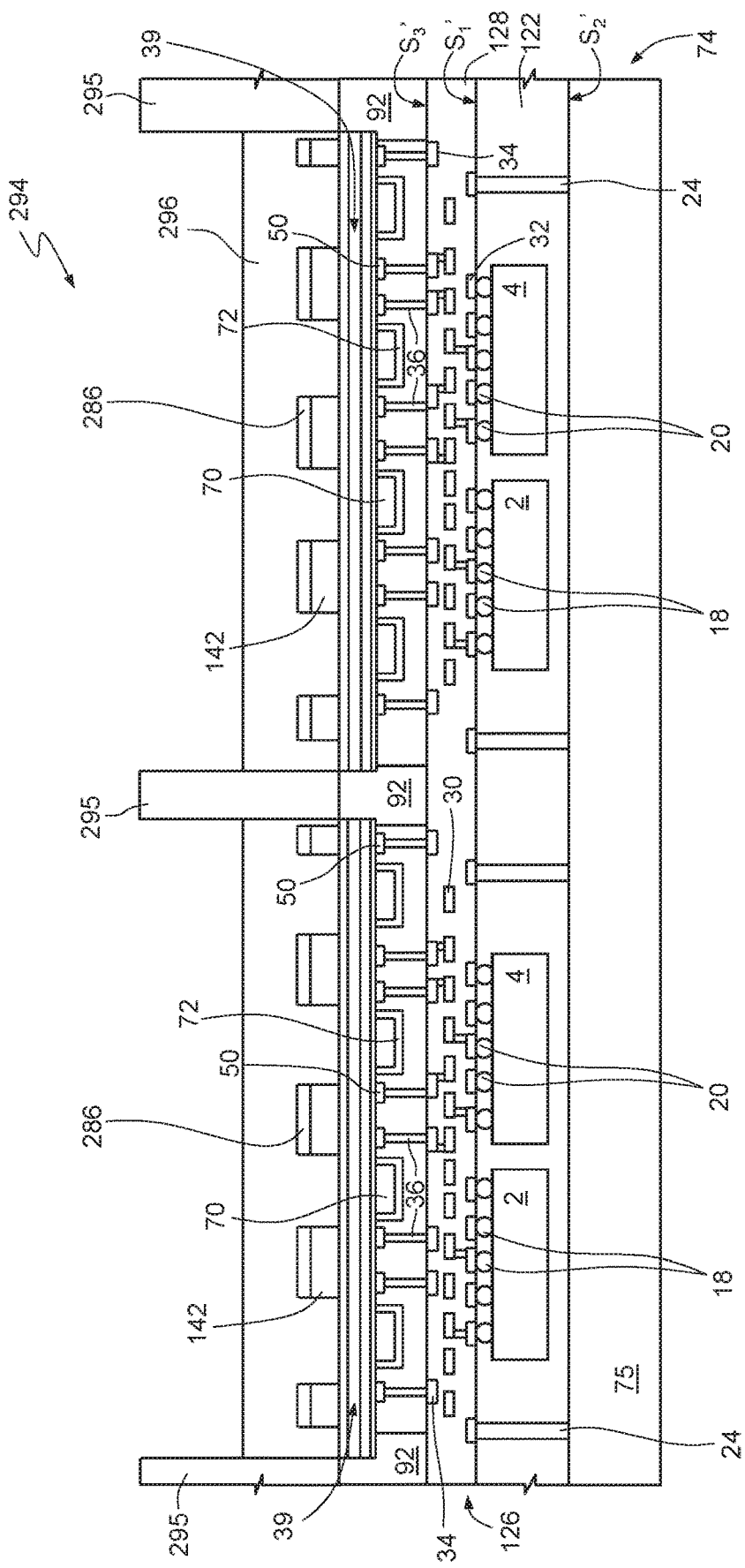

Next, as shown in FIG. 15, a covering region is formed (designated by 296) on the wafer semiconductor region 142. Subsequent removal of the support 75 and execution of dicing operations (not shown) then lead to formation of a plurality of electroacoustic modules.

The advantages that the present manufacturing process affords emerge clearly from the foregoing description.

In particular, the present process envisages formation of a sort of reconstructed wafer, using dice that form ASICs, which can be tested before formation of the reconstructed wafer, to the advantage of final reliability. Moreover, the presence of the redistribution structure of the reconstructed wafer makes it possible to decouple the pitch of the dice of the reconstructed wafer (in particular, the pitch of the bumps), from the pitch of the membranes (in particular, the pitch of the driving pads 50). Subsequent release of the membranes of the MEMS wafer 80 is carried out at the wafer level, hence with a high degree of parallelization, as well as with the possibility of producing particularly thin membranes, i.e., with a thickness of less than 10 µm. Furthermore, in the case of the variant of the manufacturing process, the semiconductor bodies 282 can be arranged on the support 200 with a high precision, improving the tolerances that characterize the electroacoustic modules thus obtained.

The present manufacturing process moreover enables use of different technologies for manufacturing MEMS transducers and dice of the reconstructed wafer.

Finally, it is clear that modifications and variations may be made to the manufacturing process described and illustrated herein, without thereby departing from the sphere of protection of the present disclosure.

For example, instead of the pillars undeformable conductive structures may be present having the shape of hollow cylinders, or else having the shape of prisms with polygonal base, which are also hollow. In this way, the shape of the membranes is defined by these conductive structures, instead of by the shape of the recesses 52 (and, hence, by the shape of the undeformable regions 42). Consequently, the undeformable regions 42 may be absent, in which case also the buried dielectric regions 86 may be absent.

Moreover, each electroacoustic module may comprise a number of dice different from the one shown, in which case the manufacturing process is accordingly modified. The transmission and reception circuits may be formed in different dice. In this case, the transmission and reception circuits may be formed using different technologies.

In general, the actuators may be of a type different from what has been described. For example, the actuators may implement an actuation mechanism of an electrostatic type, instead of a piezoelectric type. Likewise, also the arrangement of the actuators with respect to the corresponding membranes may be different from what has been described.

Finally, instead of the bumps 18, 20, other conductive connection elements may be used, such as corresponding pillars. More in general, all the conductive connection elements described herein are provided purely by way of example.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a coating region having a first surface and a second surface;
   a dielectric region of a redistribution structure having a first surface, in contact with the first surface of the coating region, and a second surface opposite to the first surface of the dielectric region;
   a die in the coating region;
   a plurality of conductive regions in the coating region, extending to the first surface of the coating region, and electrically coupled to the die;
   a plurality of conductive paths in the dielectric region of the redistribution structure and extending from the first surface of the dielectric region to the second surface of the dielectric region;
   a plurality of conductive pillars extending outward from the second surface of the dielectric region of the redistribution structure and coupled to the plurality of conductive regions by the plurality of conductive paths;
   a transduction structure including:
      a plurality of pads in electrical contact with the plurality of conductive pillars; and
      a plurality of membranes; and
   a plurality of actuators electrically coupled to the plurality of pads.

2. The device according to claim 1, wherein each pillar of the plurality of pillars has a cylindrical shape.

3. The device according to claim 1, wherein the plurality of pads is arranged on a side of the transduction structure that faces the dielectric region of the redistribution structure.

4. The device according to claim 1, wherein the transduction structure includes a multilayer region, and the multilayer region includes the plurality of membranes.

5. The device according to claim 4, further comprising a bonding region extending from the multilayer region to the dielectric redistribution region.

6. The device according to claim 5, further comprising a cavity surrounded by the bonding region, and the cavity is between the multilayer region and the dielectric region.

7. The device according to claim 6, wherein the plurality of actuators is within the cavity, the plurality of conductive pillars is within the cavity, and the plurality of pads is within the cavity.

8. The device according to claim 4, further comprising:
   a semiconductor region on the multilayer region of the transduction structure;
   a buried dielectric region on the semiconductor region; and
   a covering region on the multilayer region of the transduction structure and covering the semiconductor region and the buried dielectric region.

9. The device according to claim 8, wherein the covering region is a resin.

10. A device, comprising:
   a coating region having a first surface and a second surface opposite to the first surface of the coating region;
   a dielectric region of a redistribution structure having a first surface, in contact with the first surface of the coating region, and a second surface opposite to the first surface of the dielectric region;
   a die in the coating region;
   a plurality of conductive regions in the coating region, extending to the first surface of the coating region, and electrically coupled to the die;
   a plurality of conductive paths in the dielectric region of the redistribution structure and extending from the first surface of the dielectric region to the second surface of the dielectric region;
   a plurality of conductive pillars extending outward from the second surface of the dielectric region of the redistribution structure and coupled to the plurality of conductive regions by the plurality of conductive paths;
   a multilayer region including a plurality of membranes;
   a plurality of pads on the multilayer region and in electrical contact with the plurality of conductive pillars;
   a plurality of actuators on the plurality of membranes and electrically coupled to the plurality of pads;
   a bonding region couples the multilayer region to the dielectric region of the redistribution structure, the bonding region including a surface facing away from the multilayer region and spaced apart from the multilayer region;
   an interstitial region on and in contact with the surface of the bonding region, the interstitial region including a plurality of sidewalls transverse to the surface of the bonding region;
   a semiconductor region on the multilayer region and between respective sidewalls of the plurality of sidewalls of the interstitial region;
   a buried dielectric region on the semiconductor region; and a covering region between the plurality of sidewalls of the interstitial region, on the multilayer region, and covering the semiconductor region and the buried dielectric region.

11. The device according to claim 10, wherein:
the semiconductor region is one of a plurality of semiconductor regions; and
the buried dielectric region is one of a plurality of buried dielectric regions on ones of the plurality of semiconductor regions.

12. The device according to claim 11, wherein the covering region covers the plurality of semiconductor regions and the plurality of buried dielectric regions.

13. The device according to claim 12, wherein the covering region is a resin.

14. The device according to claim 10, wherein the covering region is a resin.

15. The device according to claim 10, further comprising a cavity between the multilayer region and the dielectric region of the redistribution structure.

16. The device according to claim 15, wherein the plurality of actuators are within the cavity, the plurality of pads are within the cavity, and the plurality of conductive pillars are within the cavity.

17. A device, comprising:
a coating region including a first surface and a second surface opposite to the first surface of the coating region;
a plurality of die in the coating region;
a plurality of connection regions in the coating region, the plurality of connection regions extending from the first surface of the coating region to the second surface of the coating region;
a redistribution structure on the second surface of the coating region;
a plurality of conductive paths in the redistribution structure coupled to the plurality of connection regions and the plurality of die;
a bonding region on the redistribution structure;
a multilayer region on the bonding region, the multilayer region including a plurality of membranes;
a cavity within the bonding region and delimited by the bonding region, the multilayer region, and the redistribution structure;
a plurality of conductive pillars within the cavity and extending from the redistribution structure to the multilayer region; and
a plurality of actuators within the cavity.

18. The device of claim 17, wherein the plurality of actuators is coupled to the multilayer region and is spaced apart from the redistribution structure.

19. The device of claim 17, further comprising:
a covering region on the multilayer region; and
a plurality of buried dielectric regions within the covering region.

20. The device of claim 17, wherein the bonding region covers sidewalls of the multilayer region.

\* \* \* \* \*